United States Patent [19]

Anderson et al.

[11] Patent Number: 4,729,062
[45] Date of Patent: Mar. 1, 1988

[54] REWORKABLE ENCAPSULATED ELECTRONIC ASSEMBLY

[75] Inventors: Edward A. Anderson, Yorba Linda; Ernesto S. Sandi, Montebello; Gerald H. Agnitsch, Gardena, all of Calif.

[73] Assignee: Hughes Aircraft Company, Los Angeles, Calif.

[21] Appl. No.: 874,969

[22] Filed: Jun. 16, 1986

[51] Int. Cl.$^4$ .............................................. H05K 5/00
[52] U.S. Cl. ..................................... 361/399; 29/829; 29/402.03; 29/402.06; 29/402.08; 174/52 PE
[58] Field of Search ......................... 156/289, 304, 344; 264/300; 29/829, 402.03, 402.06, 402.08; 174/52 PE; 361/395, 397, 399

[56] References Cited

U.S. PATENT DOCUMENTS 4,414,606 11/1983 Anderson et al. ................ 29/829 X

FOREIGN PATENT DOCUMENTS 2081637 2/1982 United Kingdom ................ 264/300

*Primary Examiner*—Howard N. Goldberg
*Assistant Examiner*—Carl J. Arbes
*Attorney, Agent, or Firm*—S. M. Mitchell; M. J. Meltzer; A. W. Karambelas

[57] ABSTRACT

A foam-encapsulated electronic assembly particularly suitable for reworking and repair operations, wherein some of the electronic subassemblies must be removed without damaging them, including a plurality of electronic subassemblies removably inserted into a frame, a release agent interposed between the subassemblies and the frame, and subassembly extraction means attached to the subassemblies prior to encapsulation. Preferably, each subassembly has structural holes such as alignment holes, and a loop of flexible line can be secured through the structural holes and encapsulated within the foam, with a part of the line positioned near or at the surface of the foam so that the line may be located when extraction is desired. The release agent can be a tape or film which prevents the foam from bonding the subassembly to the frame. The assembly also preferably includes foam cutting means between laterally adjacent subassemblies. For removal of a single subassembly without substantial damage to it or adjacent subassemblies, a rework technician can sever the foam between adjacent subassemblies and then lift the subassembly to be replaced from the frame, using the subassembly extraction means.

17 Claims, 11 Drawing Figures

4,729,062

REWORKABLE ENCAPSULATED ELECTRONIC ASSEMBLY

BACKGROUND OF THE INVENTION

This invention relates to the packaging of electronic assemblies and, more particularly, to a construction of such an assembly wherein subassemblies may be easily removed for reworking or repair.

Electrical and electronic assemblies intended for many space and military applications are assembled in a modular form, wherein components are assembled into subassemblies, and then the subassemblies are assembled to form the assembly. To the extent logically possible, the assemblies are assembled from the subassemblies within a single frame, commonly termed a "slice". The slices may in turn form part of a larger, more complex device. By way of example, a small, special purpose computer can be assembled by placing the central processor into one subassembly, a clock into another subassembly, input/output functions into another subassembly, and memory into one or more additional subassemblies. The subassemblies, typically of the size of 1 inch wide by 5 inches long by 0.2 inches thick, are then mounted together in a laterally side-by-side relationship within a frame which is large enough to physically accommodate the subassemblies. The frame usually includes side rails to which the subassemblies are attached, and a header card for use in electrically connecting the subassemblies together as necessary. The frames thus provide a convenient structure for assembling the device, and for handling the device as a single unit.

If such a device fails during operation, the entire frame can be quickly removed by a service technician and replaced with an operating device. The failed assembly contained within the frame can then be inspected to determine which subassembly has failed, and the failed subassembly is replaced. The subassemblies and frames are designed with such procedures in mind, so that circuitry and inspection points are provided to determine the precise location of a failed subassembly or component.

The described construction is widely used in space and military applications, where the electronic assemblies may be subjected to mechanical shocks and vibrations. For example, when a satellite is boosted from earth to orbit, the electronic components may be subjected to considerable vibration, and the electronic components, subassemblies and frames must be packaged in such a way as to withstand the vibrations with no damage. One effective approach for such packaging has been found to be encapsulation of the sensitive subassemblies in a rigid, shock absorbing foam. Encapsulation is accomplished by first inserting the subassemblies into the frame, placing chemicals into the spaces within the frame between the subassemblies, and allowing these chemicals to react to form a foamed reaction product. The foam fills the spaces between the individual components of the subassemblies, between the adjacent subassemblies, and between the subassemblies and the sides of the frame.

Foam encapsulation has been found to be a highly effective way of protecting the devices constructed in the described manner. However, the foam also acts much like a glue or adhesive to bond the subassemblies tightly into the slice assembly. At a later time, if it is necessary to repair the device contained within the slice, the foam makes the removal of a subassembly very difficult and time consuming.

To remove a subassembly, it was long the standard practice that a rework technician would use a sharp tool to manually dig, pick, carve, slice and fracture the foam around the subassembly to isolate it from the remainder of the foam, and then gradually work the subassembly free to allow replacement. The subassemblies are usually laterally spaced less than about ⅛ inch apart within the frame, and this manual procedure often resulted in unintended damage to the subassembly being replaced, and sometimes to adjacent subassemblies. A skilled worker might require at least ½ hour to remove the subassembly from its encapsulation, and less skilled workers might require as much as two or more hours to remove the subassembly, a process termed "defoaming".

An important advance in the defoaming of subassemblies is disclosed and claimed in U.S. Pat. No. 4,414,606, which describes a structure and technique for accomplishing a portion of the defoaming process. Specifically, a mechanical cutting medium in the form of a sinuous filament is placed between each pair of laterally adjacent subassemblies, so that the foam between the subassemblies can be fractured by pulling the filaments to removed them from the foam. As the filaments are removed, the foam between adjacent subassemblies is cut.

The disclosure of U.S. Pat. No. 4,414,606 indicates that, once the foam is cut, nuts and electrical connections which would hold the subassembly in place are removed, and the subassembly is then simply lifted out of the frame. However, for some arrangements of the subassemblies and frames, the situation is not this simple, and it may be difficult to lift the subassembly out of the frame even after the foam is cut in the manner described. The difficulties arise because the foam acts like a glue to bind the subassembly to the frame itself, and because geometrical constraints make it impractical to use the mechanical cutting approach between the subassembly and the frame. The subassembly therefore tends to adhere to the frame along the side rails and header board of the frame, and it may be difficult to remove the subassembly. The technician therefore must resort to the prior technique of digging away the foam with a sharp instrument, but may then damage the components or expand large amounts of time in the removal process.

Thus, while U.S. Pat. No. 4,414,606 represents an important advance in the art of defoaming, there remains a further need for an assembly which is adapted for removal of subassemblies for repair or reworking, and a method by which subassemblies may be removed without damaging the removed subassembly or adjacent subassemblies. Such as assembly and method must be fully compatible with the electronic devices themselves, since it is not possible to redesign the subassemblies, frames, or device electronics to accommodate the removal and reworking needs. The present invention fulfills this need, and further provides related advantages.

SUMMARY OF THE INVENTION

The present invention resides in an electronic assembly specially adapted so that subassemblies are safely and firmly encapsulated in a frame, but may be removed from the frame for repair or reworking procedures quickly, efficiently, and with minimal risk of damage to the subassembly being removed, or to other subassemblies. The electronic assembly and removal technique are fully compatible with existing designs of components, subassemblies, frames and devices, so that the electronic assembly of the invention may be readily and interchangeably substituted for conventional electronic assemblies. The electronic assembly of the invention requires only relatively inexpensive modifications and additions to conventional assemblies.

In accordance with the invention, an electronic assembly comprises a frame, at least one electronic subassembly inserted into the frame, encapsulating means positioned between the subassembly and the frame and acting to join the subassembly to the frame, thus hampering the removal of the subassembly from the frame, and a release agent interposed between the subassembly and the frame, whereby the release agent allows the subassembly to be parted from and removed from the frame. Desirably, the assembly also includes foam cutting means embedded in the foam between laterally adjacent subassemblies. The release agent may be a tape or a film, or have some other form. The release agent may be applied to the frame, to the subassembly itself, or to some intermediate structure. Preferred release agents include teflon and parylene.

In another embodiment, an electronic assembly comprises a frame, at least one electronic subassembly removably inserted into the frame, a foam within the space defined by the frame and encapsulating the subassembly, a release agent interposed between the subassembly and the frame, and subassembly extraction means attached to the subassembly for extracting the subassembly. The release agent is as previously described. The subassembly extraction means preferably includes a flexible line knotted through structural holes at opposing ends of the subassembly, and knotted with a particular type of non-slip knot.

Removal of the subassembly from the frame is facilitated because of the release agent, which prevents the encapsulating means from adhering the subassembly to the frame of the assembly. In the preferred embodiment, having the described subassembly extraction means embedded in the foam, the subassembly can be lifted out by grasping the flexible lines and gently drawing out the subassembly from the frame. In the most preferred embodiment, the foam cutting means is operated to sever the foam lying between adjacent subassemblies prior to drawing out the subassembly from the frame. Thus, in removing a subassembly using the most preferred embodiment of the invention, the foam lying between adjacent subassemblies is first severed using the foam cutting means. The subassembly is then lifted out of the frame by grasping the flexible lines at either and of the subassembly, which are attached to the subassembly prior to encapsulation in the foam. The release agent allows the subassembly to be drawn out of the frame without substantial adherence to the frame, thereby minimizing the risk of damage to either the subassembly being removed or subassemblies remaining.

The release agent is preferably formed of known release materials, such as teflon or parylene, which are available in forms that allow them to be applied to the frame or to the subassembly itself. These release agents are also available in forms which allow them to pass through baking cycles unharmed. Moreover, such release agents do not adversely affect operation of the electronic components and subassemblies. The subassembly extraction means may be formed of nonconducting materials which are also sufficiently stable that they may pass unharmed through typically heating and cooling cycles, such as para-aramid thread.

As will now be appreciated, the electronic assembly and method for removing allow the construction of electronic devices using conventional electronic technology of components installed into subassemblies, which are in turn assembled into frames or slices. The electronic assembly allows the efficient extraction and removal of individual subassemblies which may have malfunctioned, without damaging the subassembly or adjacent subassemblies. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
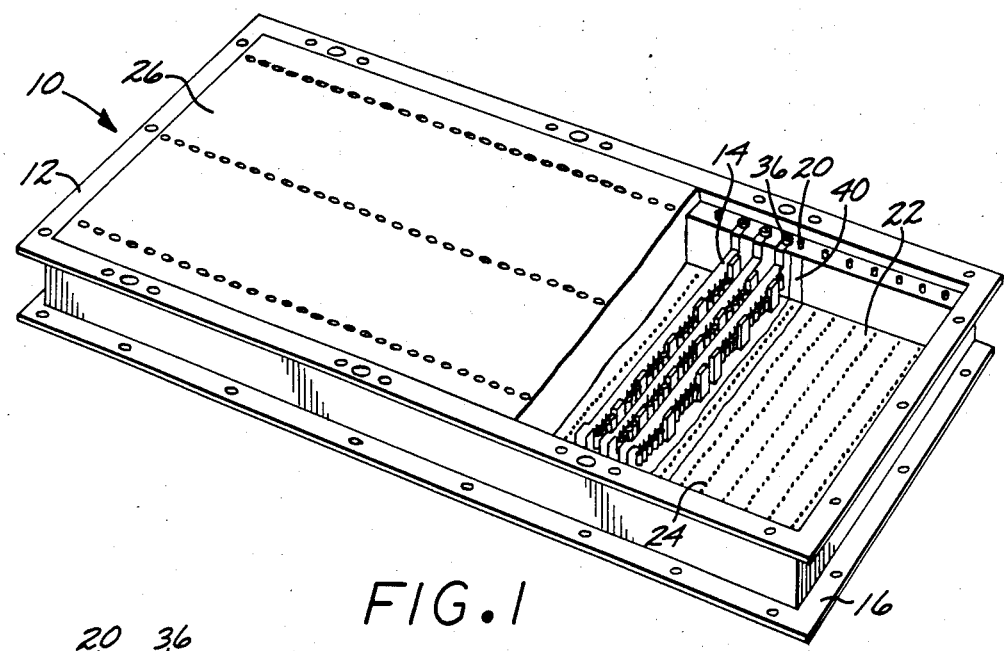
FIG. 1 is a perspective view of a foam-encapsulated frame assembly, with subassemblies mounted therein, with a portion of the foam removed to show the arrangement of the subassemblies and components.

One preferred form of the present invention is embodied in an electronic assembly 10, also termed a slice or a microelectronic circuit assembly module (MICAM). The electronic assembly 10 is typically mounted in a rack or other structural support, and may incorporate an entire operating device or be one component of a larger device. Such modular electronic assemblies are popular for use in apparatus which may require repair or replacement during use, since techniques have been developed to isolate the source of faults to a particular electronic assembly, and thence to parts of the assembly.

The electronic assembly 10 typically includes a generally rectangular frame 12 having internal dimensions sufficiently large to accommodate the installation of a plurality of electronic subassemblies 14. In one widely used form, the electronic assembly 10 has external dimensions of about $5\beta$ inches wide by about 1½ inches thick with a length sufficiently long to accommodate the number of electronic subassemblies required, such as about 8 to about 22 inches. In this form, the internal dimensions are about 51/16 inches wide and 1½ inches in thickness. The frame 12 may be constructed of any suitable structural material, such as a metal or plastic, and has a shape which promotes rigidity with minimum weight. The frame 12 illustrated in FIG. 1 can be machined out of a solid piece of metal, or can utilize four U-shaped channels 16 joined at their ends to form a rectangular chassis or frame. The sides of two of the channels 16 can be provided with bolt holes or other means for attaching the frame 12 to its support structure. The broad faces of the frame 12 may optionally be provided with covers.

Extending along the inside of the frame 12 are a pair of oppositely disposed side rails 18, which support the electronic subassemblies 14 in a laterally side-by-side arrangement. The oppositely disposed side rails 18 are spaced a sufficient distance apart to physically receive the standardized electronic subassemblies 14. The side rails include a plurality of laterally spaced apart threaded mounting studs or posts 20, which receive and support the electronic subassemblies 14, in a manner to be described. A header card 22 is mounted in the frame 12 adjacent and parallel to one of the broad faces of the frame 12. The header card 22 is supported from side rails 18 by a nonconducting support such as a nylon bracket 23. The header card 22 is not primarily a structural element, but instead provides a working surface through which electronic connectors extend and may be joined together, as by wiring. The header card 22 is typically an electrically nonconducting plastic or epoxy laminated material through which an array of exit holes 24 is formed. Rows of exit holes 24 extend from one side of the header card 22 to the other, generally in alignment with the posts 20.

After the microelectronic subassemblies 14 are installed into the frame 12, wired together as necessary to accomplish particular functions, and tested, the electronic subassemblies 14 are typically encapsulated to protect them from physical damage such as induced by shock or vibration, and further to insulate the subassemblies 14 from each other and from external electrical contact. In one such approach, a rigid foan 26 is formed within the physical boundaries of the frame 12. Such foams are well known in the art, and may be produced by a variety of techniques. In one approach, tooling (not shown) is attached to the frame 12 to define the final shape of the foam, and chemicals are placed within the frame 12 and the tooling. Shortly after mixing, the chemicals react to form a foam which expands to fill the available volume allowed by the structure of the frame 12 and the tooling. The foam may be cured into a hard, rigid, protective structure by subsequent curing at elevated temperature. An acceptable material is a rigid polyurethane foam available from the Expanded Rubber & Plastic Corp. as Strathane 502SE.

Once the form has been foamed into position, physical access to the electronic subassemblies 14 is difficult. Physical access is not required in normal operation. If one of the electronic subassemblies 14 fails it may be necessary to remove the subassembly 14, and replace it with another subassembly, or repair the failed subassembly for reuse. In the past, the usual approach to removing one of the electronic subassemblies 14 was to use a sharp instrument to manually dig, pick, carve, slice and fracture the foam away from the subassembly 14, and then to work the subassembly 14 free from the frame 12. Because the subassemblies 14 are usually spaced laterally less than about ½ inch apart, the technician performing the removal operation was required to work in a tightly confined space. As a result, damage often occurred to the subassembly being removed, or to adjacent subassemblies. Additionally, if all of the foam was not properly removed, then the electronic subassembly 14 would continue to adhere to the header card 22 or the side rails 18, with the result that the electronic subassembly 14 might be physically broken into smaller pieces by the stress of removing it.

In U.S. Pat. No. 4,414,606, whose disclosure is herein incorporated by reference, a technique was disclosed for mechanically fracturing the foam lying between laterally adjacent electronic subassemblies 14. Briefly, this approach involves the incorporation of a guided cutting apparatus into the structure of the electronic assembly 10 prior to foam encapsulation, and then the operation of this cutting apparatus when removal of a particular electronic subassembly 14 is required. This approach has greatly reduced the incidence of damage to adjacent subassemblies which are not to be removed, and has also greatly reduced the amount of manual labor required to remove a particular electronic subassembly 14. However, it has been observed that, even with the use of this approach, the subassemblies 14 are not readily and freely drawn out of the frame 12, because the subassembly 14 continues to adhere to the side rails 18 and header card 22 portions of the frame 12. That is, the foam (and other typical encapsulation materials) acts as a glue or adhesive to bind the subassembly 14 to the frame. A better understanding of this problem is gained by examining the structure and mounting relationship of the subassemblies 14 in greater detail.

Electronic subassemblies 14 can assume a wide variety of different configurations, depending upon the type and size of individual components 28 which are required in the electronic circuitry of the subassembly 14. That is, small or large discrete components 28 may be used, or the components may be circuit cards or microelectronic circuits. In a typical approach, illustrated in FIGS. 2-4, moderately sized components 28 are bonded in a side-by-side fashion along a backbone structure 30, which extends from one of the side rails 18 to the other. The backbone structure 30 acts as a structural support, optionally can act as a heat sink to remove unwanted heat from the component 28, and may additionally perform other functions. At each end, the backbone structure 30 is provided with an L-shaped bracket 32 having a broad face oriented parallel to the broad face of the frame 12. A mounting hole 34 is provided in the broad face of the bracket 32, and these mounting holes 34 are dimensioned to slip over and be received by the threaded posts 20 mounted on the side rails 18. The electronic subassemblies 14 are secured to the side rails 18 by mounting nuts 36 which engage the posts 20 and are tightened thereupon.

Extending downwardly from the backbone structure 30 is a series of exit pins 38, which are positioned and dimensioned to fit through the exit holes 24 on the header card 22, when the backbone structure 30 is properly fastened to the side rails 18. The exit pins 38 can then be used to provide electrical connections between the components 28 and exit pins 38 corresponding to adjacent subassemblies, or can be used to provide external connections for the electronic assembly 10.

As may now been seen, there are extensive regions where the electronic subassembly 14 may be bonded to the side rails 18 and to the header card 22, because of the close proximity of these structures and because there are many structural features which allow an adherence to be developed. It is not possible to utilize the foam cutting means of U.S. Pat. No. 4,414,606 to free the electronic subassembly 14 from contact with the side rails 18 and the header card 22, since these areas of close proximity are located in an inaccessible position beneath the electronic subassembly 14.

In accordance with the present invention, a release agent may be interposed between the electronic subassembly 14 and the frame 12. More specifically, the release agent is usually placed directly between the subassembly 14 and the bracket 23, and between the subassembly 14 and the header card 22. The release agent may take any appropriate form which allows the bonding otherwise produced by the presence of the foam to be avoided, without resort to mechanical cutting of the foam. As noted, mechanical cutting of the foam is not practical in such inaccessible locations.

Figure 2:
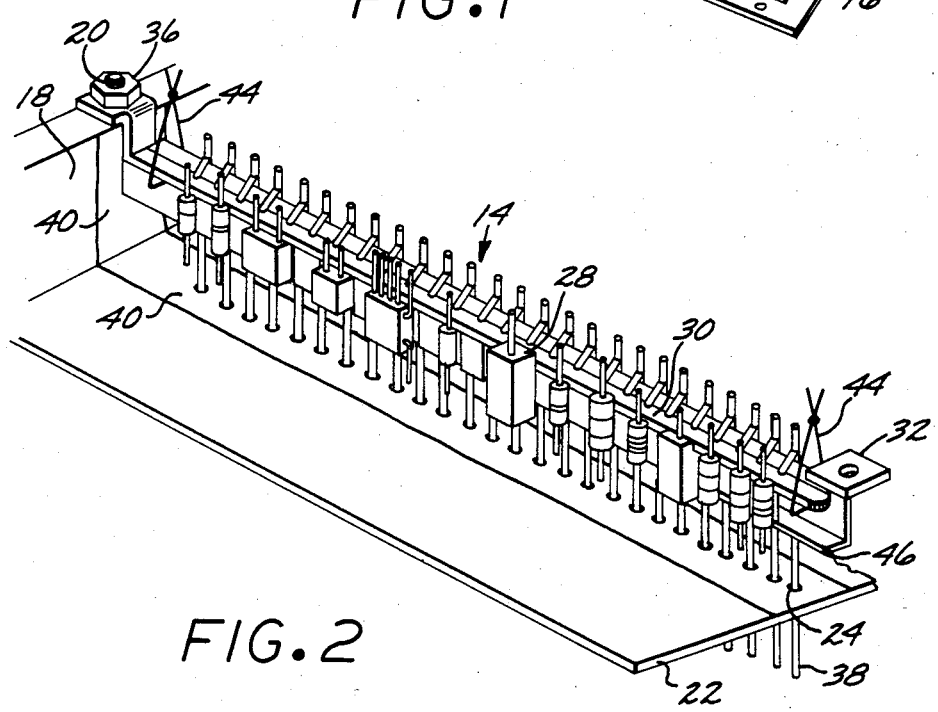
FIG. 2 is an enlarged perspective view of a MICAM stick subassembly with lift-out loops installed.
Figure 3:
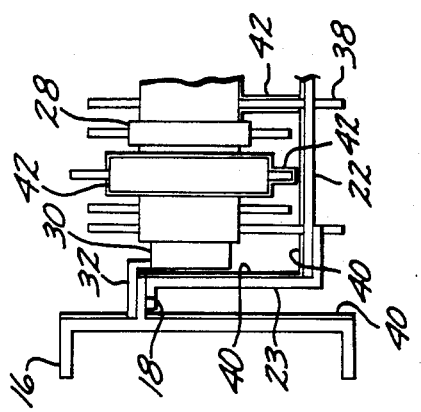
FIG. 3 is a detail of FIG. 1, showing the installation of a subassembly into the frame.

In one form, the release agent can be a tape (or equivalently, a sheet) material which is laid into place between the subassembly 14 and the frame 12. As illustrated in FIGS. 1-3, such a release agent may be a tape 40 which is placed against the inner surface of the header card 22 and the inner surface of the bracket 23, prior to the time that the electronic subassembly is assembled into the frame 12. When the foam 26 is installed into the frame 12, the presence of the release agent, here the tape, prevents a structural bond from forming from the subassemby 14 to the frame 12. Since the foam 26 typically expands as it is formed, the foam is under sufficient compression that the absence of the bond does not result in the formation of any internal cavities or cracks within the foam 26. To the contrary, the foam can have excellent shock and vibration absorbing characteristics, but not result in a continuous bond between the electronic subassembly 14 and the frame 12.

The tape 40 is most conveniently applied against a flat surface such as the inside of the header card 22 or the side rails 18. Alternatively, it is possible, but usually not convenient, to install the tape 40 agains the electronic subassembly 14 or at an intermediate position between the subassembly 14 and the frame 12. However, if the components 28 are large and have flat faces, the tape may be readily installed on the subassembly 14.

If it is desired to achieve the release of the components 28, the backbone structure 30, or other parts of the subassembly 14 from the foam, so that the subassembly 14 can be readily drawn out of the frame 12, the release agent can be applied directly to the subassembly 14. As illustrated in FIG. 3, a film 42 of release agent can be applied to the component 28 or other parts of the subassembly 14. As used herein, a release agent in the form of a film is a thin layer of material which physically disrupts the continuity of the bond between the subassembly 14 and the frame 12, or other feature. Such films 42 can be provided in several different ways. For example, a release agent may be sprayed from a pressurized spray can, or a film 42 can be formed from reactive gasses or liquids which deposit the film 42 onto a surface.

The preferred form of a tape 40 is teflon (polytetrafluoroethylene) tape sold by 3M Company, Minneapolis, Minn. as type No. 63 teflon tape. One preferred form of a film 42 is produced by spraying a surface to be coated with a teflon aerosol spray, commercially available from Miller-Stephenson Company as type MS-122 spray. Another preferred film is produced by introducing hot parylene gas against the cold material of the surface to be coated. Upon contacting the surface, the parylene gas deposits a layer of long chain polymers, one end of which is anchored to the surface and the other end of which extends above the surface to prevent the formation of a bond between the encapsulating foam and the surface. In selecting a release agent, a primary consideration is the temperature to which the electronic assembly 10 may be heated during fabrication or use. In many applications, the electronic assembly is heated to about 200° F. to cure the foam 26, but cannot be heated to a temperature of greater than about 260° F. because of the sensitivity to heat of the components 28.

In another aspect of the invention, subassembly extraction means attached to the subassembly 14 is provided to allow the subassembly 14 to be drawn out of the frame 12, when the subassembly 14 is to be removed. The subassembly extraction means is preferably a pair of lifting loops 44 attached to the opposite ends of the electronic subassembly. Each subassembly 14 normally includes a structural hole 46 at each end of the backbone structure 30, extending through the entire thickness of the backbone structure 30. This structural hole 46 is typically provided as a tooling or alignment hole which is used to hold the backbone structure 30 in a stationary position when the components 28 are made. These structural holes 46 previously provided no subsequent function, after their function as tooling holes had been completed. In the present invention, the subassembly extraction means is attached through the structural holes 46 prior to the time that the subassembly 14 is installed into the frame 12. When the subassembly 14 is installed into the frame and the foam 26 is installed, the lifting loops 44 are embedded into the foam and may project slightly above the surface of the foam 26.

The preferred form of the subassembly extraction means is the lifting loop 44, which is a thin string or filament such as polyester (Dacron) thread or nylon filament. The selected material must withstand the temperature to which the assembly 10 is heated, must be electrically non-conductive to avoid the possibility of a short circuit between components 28 or adjacent subassemblies 14, and is preferably of a contrasting color so that it may be readily located when it is desired to remove the subassembly 14. The most preferred material of construction of the lifting loop 44 is size 3 para-aramid thread meeting standard MIL-T-87128.

Figure 5A:
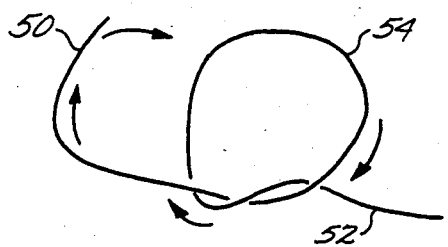
FIG. 5a–5g is a diagrammatic flow chart for the tying of a knot useful in forming a lift out loop, together with the final form of the knot.
Figure 5B:
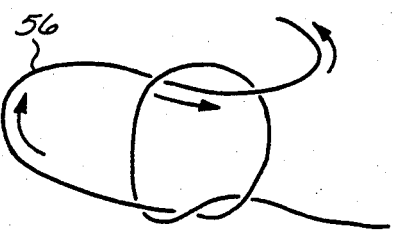
Figure 5C:
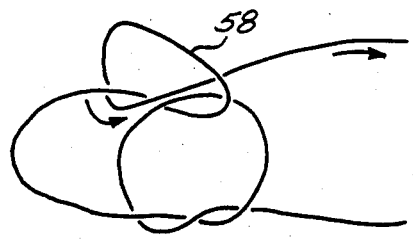
Figure 5D:
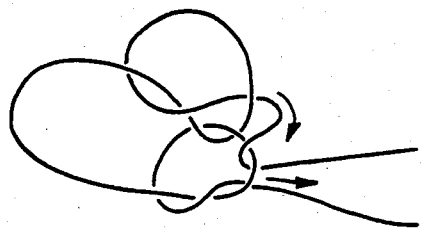
Figure 5E:
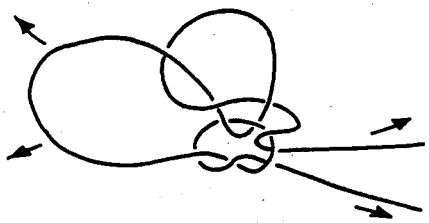
Figure 5F:
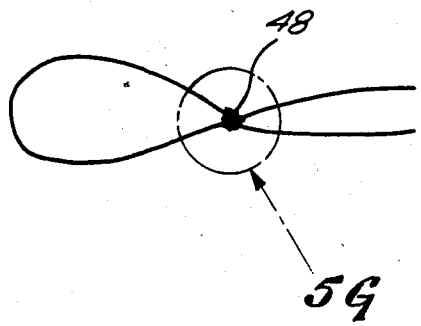
Figure 5G:
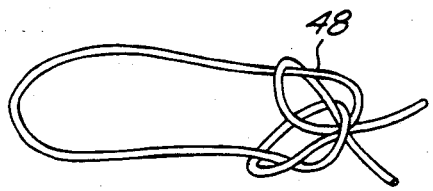

It is highly desirable that the lifting loop 44 be knotted to the electronic subassembly 14 through the structural hole 46 using a knot which will not slip or become loosened during an extended period of time. A knot 48 has been developed for this purpose. This knot 48 is illustrated in FIG. 5G, and the stages of typing the knot are illustrated in FIG. 5A-5F. To tie the knot 48, a free end 50 of a line 52 is used to form a half hitch on the line 52, thereby forming a first loop 54. The free end 50 is then passed through the loop from the bottom (having emerged from the first loop 54 to the top side). This forms a main loop 56 which passes through the structural hole 46 and thereby permanently engages the backbone structure 30 and subassembly 14. The free end is then passed back under the line 52 as it enters the first loop 54, thereby forming a second loop 58. As the free and 50 emerges from the second loop 58, it is passed downwardly through the first loop 54. The knot 48 is then formed, and may be tightened by drawing on the four pieces of line extending from the knot 48. While this knot is not absolutely required, it has been found highly successful in attaching a very fine line through the structural hole 46 of an electronic subassembly 14, to form a permanent non-slip knot.

Figure 4:
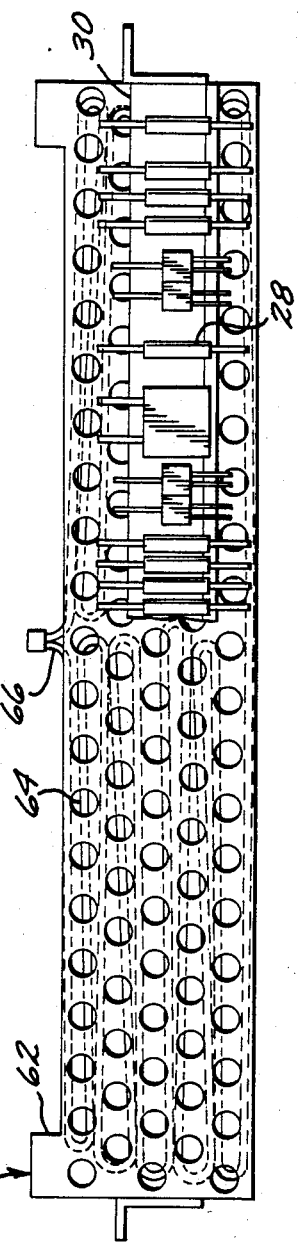
FIG. 4 is an enlarged, partially fragmented side sectional view of a subassembly and a portion of a foam cutting means.

Optionally, foam cutting means such as disclosed in U.S. Pat. No. 4,414,606 is also provided in the electronic assembly 10. Referring to FIG. 4, such a foam cutting means can include a sandwich structure 60 placed between laterally adjacent pairs of electronic subassemblies 14. Each sandwich assembly 60 includes a pair of guides 62 which support and align a filament 64, which is wound in a sinuous fashion across the thickness of the frame 12. One end of the filament 64 is turned upwardly so that it is near or at the surface of the foam, after the foam 26 is installed in place. This upwardly projecting end of the filament 64 then becomes a handle 66 for grasping the filament 64.

The various aids for removing the subassemblies 14 are installed prior to the foaming operation, and remain in place until defoaming or removal of the subassembly 14 is desired.

In the most preferred form of the present invention, the release agent and subassembly extraction means are utilized, as well as the foam cutting means. Using this form of the invention, when it is desired to remove a particular subassembly 14, the technician first locates the handle 66 and pulls the filament 64 out of the foam 26, thereby cutting the foam between the subassembly that is to be removed and the adjacent subassembly. This procedure is repeated on the other side of the subassembly that is to be removed. Upon completion of this foam cutting step, the foam has been severed on each side of the electronic subassembly 14. The technician then locates the post 20 and mounting nuts 36 at each end of the subassembly to be removed, and removes the mounting nuts 36. Any cross wiring or other connections on the underside of the header card 22 are removed, if this has not been done previously, which might prevent the subassembly 14 from being removed. The technician then locates the lifting loops 44 at each end of the backbone structure 30. The subassembly 14 is drawn out of the frame 12 and lifted upwardly clear of it by pulling on the lifting loops 44 either manually or with special tooling. It is desirable that the subassembly 14 be drawn out of the frame 12 evenly and without cocking the subassembly either side-to-side or end-to-end, since such an irregularity could cause binding and possible breakage of the subassembly 14.

It has been found that the use of the preferred release agent is highly successful in preventing any bonding of the subassembly 14 to the frame 12, by the foam 26. Thus, it is not required that the technician dig into the foam with a sharp instrument in order to free the subassembly 14 from the frame 12.

In the approach just described, the subassembly 14 is lifted free of the frame 12 with a block of foam 26 still adhering to the subassembly 14. In some instances, this may be desirable, while in other instances it may be desirable to completely defoam the subassembly 14. In the latter instances, the release agent can be applied directly to the subassembly 14, as in the form of a film 42, so that the foam is readily separated from the subassembly 14.

At this point, the removed subassembly can be repaired and then replaced into the frame 12, or a new subassembly can be used. In either event, the replacement subassembly is installed by first removing and replacing the sandwich structures 60 on either side of the subassembly that was removed. The new sandwich structure 60 allows the removal process to be later repeated. The replacement subassembly 14 is then installed with the exit pins 38 projecting through the header card 22, and fastened to the posts 20. The electronic connections on the underside of the header card 22 are made, and the circuitry is tested. If the replacement circuitry and the entire electronic assembly 10 then function correctly, new foam is installed around the replaced subassembly 14, and the assembly 10 can be returned to service.

As is now appreciated, the present invention, particularly when combined with the invention of U.S. Pat. No. 4,141,606, provides an important advance in the repair of expensive electronic assemblies and devices. In the past, the removal of a defective subassembly was a tedious and difficult process, which often resulted in even further damage to the defective subassembly or adjacent nondefective subassemblies. The present approach completely avoids these problems, and allows the defective subassembly to be easily and quickly removed for repair. The materials used and the techniques of the present invention are fully compatible with existing electronic circuit techniques and construction, and require no redesigning and very little change in assembly technique. The materials are relatively inexpensive, when compared with the cost of the circuitry. The newly added elements do not pose any risk of electrical shorting or other damage to the circuitry. Moreover, the materials add very little weight, an important consideration in spacecraft and aircraft.

Although a particular embodiment of the invention has been described in detail for purposes of illustration, various modifications may be made without departing from the spirit and scope of the invention. Accordingly, the invention is not to be limited except as by the appended claims.

What is claimed is:

1. An electronic assembly, comprising:
   a frame;
   at least one electronic subassembly removably inserted into said frame;
   a foam within the space defined by said frame and encapsulating said subassembly;
   a release agent interposed between said subassembly and said frame; and
   subassembly extraction means attached to said subassembly for extracting said subassembly.

2. The assembly of claim 1, wherein said assembly further includes:
   foam cutting means for cutting the foam mechanically, said foam cutting means being laterally adjacent said subassembly and embedded in said foam.

3. The assembly of claim 1, wherein said frame includes mounting brackets on the sides of said frame adapted for attaching said subassembly to said frame, and said release agent is interposed between said brackets and said subassembly.

4. The assembly of claim 1, wherein said subassembly has a structural hole each opposing end thereof, and said subassembly extraction means is attached to said subassembly through said holes.

5. The assembly of claim 4, wherein said subassembly extraction means includes a flexible line knotted through one of said holes.

6. The assembly of claim 5, wherein said subassembly extraction means is knotted with a knot as illustrated in FIG. 56 hereof.

7. An electronic assembly, comprising:
   a frame;
   at least one electronic subassembly inserted into said frame;
   encapsulating means positioned between said subassembly and said frame and acting to join said subassembly to said frame, thus hampering the removal of said subassembly from said frame; and
   a release agent interposed between said subassembly and said frame, whereby said release agent allows said subassembly to be parted from and removed from said frame.

8. The assembly of claim 7, wherein said release agent is a tape.

9. The assembly of claim 7, wherein said release agent is a film.

10. The assembly of claim 7, wherein said release agent is applied to said frame.

11. The assembly of claim 7, wherein said release agent is applied to said subassembly.

12. The assembly of claim 7, wherein said release agent is selected from the group consisting of polytetrafluoroethylene and parylane.

13. The assembly of claim 7, wherein said assembly includes at least two of said subassemblies positioned laterally adjacent each other, and wherein said encapsulating means is a foam, and wherein said assembly further includes:
foam cutting means embedded in said foam between said laterally adjacent subassemblies.

14. A method of removing an electronic subassembly from an electronic assembly, comprising the steps of:
obtaining an electronic assembly having
a frame, at least one electronic subassembly inserted into said frame,
encapsulating means positioned between said subassembly and the frame and joining said subassembly to the frame, thus hampering the removal of the subassembly from the frame, and
a release agent interposed between the subassembly and the frame;
extracting the subassembly from the frame, whereupon the release agent allows the subassembly to be parted from and removed from the frame.

15. The method of claim 14, wherein said electronic subassembly further includes subassembly extraction means attached thereto for use in said step of extracting.

16. The method of claim 15, wherein the electronic subassembly has a structural at each opposing end thereof and the subassembly extraction means includes a flexible line knotted through each hole, and wherein said step of extracting includes a step of
drawing the subassembly out of the frame by means of the flexible line.

17. The method of claim 14, wherein the encapsulating means is a foam, and wherein the assembly includes foam cutting means for cutting the foam mechanically, the foam cutting means being laterally adjacent the subassembly and embedded in the foam, and wherein said step of extracting includes a step of
operating the foam cutting means to cut the foam laterally adjacent the subassembly.

* * * * *